(12) United States Patent
Liu et al.

(10) Patent No.: US 11,067,623 B2
(45) Date of Patent: Jul. 20, 2021

(54) TEST SYSTEM AND METHOD OF OPERATING THE SAME

(71) Applicant: Test Research, Inc., Taipei (TW)

(72) Inventors: Ming-Hsien Liu, Taipei (TW); Hsin-Wei Huang, Taipei (TW)

(73) Assignee: Test Research, Inc., Taipei (TW)

( * ) Notice: Subject to any disclaimer, the term of this patent is extended or adjusted under 35 U.S.C. 154(b) by 59 days.

(21) Appl. No.: 16/416,260

(22) Filed: May 19, 2019

(65) Prior Publication Data

US 2020/0363465 A1 Nov. 19, 2020

(51) Int. Cl.
*G01R 31/28* (2006.01)
*G01R 31/50* (2020.01)

(52) U.S. Cl.
CPC ....... *G01R 31/282* (2013.01); *G01R 31/2832* (2013.01); *G01R 31/50* (2020.01)

(58) Field of Classification Search
None
See application file for complete search history.

(56) References Cited

U.S. PATENT DOCUMENTS

| | | | |
|---|---|---|---|
| 7,080,300 B1 * | 7/2006 | Herron | G01R 31/31717 714/726 |
| 10,048,304 B2 * | 8/2018 | King | H01L 22/20 |
| 2004/0255216 A1 | 12/2004 | Ichiyoshi | |
| 2006/0282735 A1 * | 12/2006 | Weinraub | G01R 31/31905 714/742 |
| 2009/0134904 A1 * | 5/2009 | Zjajo | G01R 31/318536 324/750.3 |
| 2018/0128873 A1 * | 5/2018 | Petrov | G01R 31/2834 |

FOREIGN PATENT DOCUMENTS

| | | |
|---|---|---|
| TW | 200506397 A | 2/2005 |
| TW | 201031937 A | 9/2010 |
| TW | 201725398 A | 7/2017 |
| WO | 2005114236 A1 | 12/2005 |

* cited by examiner

Primary Examiner — Jermele M Hollington
(74) Attorney, Agent, or Firm — CKC & Partners Co., LLC

(57) ABSTRACT

A test system includes a plurality of test core devices and a plurality of first buses. The plurality of test core devices are electrically connected to a device under test (DUT). The plurality of first buses are electrically connected to the test core devices, where at least one set of test core devices selected from the plurality of test core devices are merged to be a merged test core device through one or more of the plurality of first buses.

10 Claims, 5 Drawing Sheets

TEST SYSTEM AND METHOD OF OPERATING THE SAME

BACKGROUND

Field of Invention

The present invention relates to test systems and methods of operating the test systems.

Description of Related Art

A device under test (DUT), also known as equipment under test (EUT) and unit under test (UUT), is a manufactured product undergoing testing, either at first manufacture or later during its life cycle as part of ongoing functional testing and calibration checks. This can include a test after repair to establish that the product is performing in accordance with the original product specification. In the electronics industry, the DUT is any electronic assembly under test.

In conventional art, an additional wire is needed to manually connect two test modules. This manner is not convenient.

SUMMARY

An embodiment of the present disclosure is related to a test system. The test system includes a plurality of test core devices and a plurality of first buses. The plurality of test core devices are electrically connected to a device under test (DUT). The plurality of first buses are electrically connected to the test core devices, where at least one set of test core devices selected from the plurality of test core devices are merged to be a merged test core device through one or more of the plurality of first buses.

In one embodiment, the merged test core device and the other of the plurality of test core devices test the DUT in parallel.

In one embodiment, any one of the plurality of test core devices includes at least one switching device and a controller. The at least one switching device is electrically connected to the one or more of the plurality of first buses. The controller is electrically connected to the at least one switching device.

In one embodiment, the any one of the plurality of test core devices further includes a plurality of second buses. The plurality of second buses are electrically connected to the controller and at least one switching device.

In one embodiment, the plurality of test core devices comprises a first test core device, a second test core device, a third test core device and a forth test core device, the first test core device, the second test core device, the third test core device and the forth test core device are merged to be the merged test core device for testing the DUT, the first test core device sends a electrical signal to the DUT, the forth test core device receives the electrical signal through the DUT, and an output of the forth test core device is switched to be electrically connected to the first test core device through the one or more of the plurality of first buses, so that the first test core device measures a test signal through the DUT.

In one embodiment, the second test core device and the third test core device electrically connects two terminals of the DUT respectively, and outputs of the second test core device and the third test core device are switched to be electrically connected to the first test core device through the one or more of the plurality of first buses, so that the first test core device measures a test electrical signal through the DUT.

In one embodiment, the amount of the at least one set of test core devices to be merged is related to the amount of test points of the DUT.

Another embodiment of the present disclosure is related to a method of operating a test system. The method includes steps of: selecting at least one set of test core devices from a plurality of test core devices of the test system; and merging the at least one set of test core devices to be a merged test core device through one or more of the plurality of first buses for testing a DUT.

In one embodiment, the step of selecting the at least one set of test core devices includes: receiving a merging signal; and selecting the at least one set of test core devices according to the merging signal.

In one embodiment, the step of selecting the at least one set of test core devices includes: acquiring the amount of test points of the DUT; determining a merged amount based on the amount of test points of the DUT; and selecting the at least one set of test core devices according to the merged amount.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
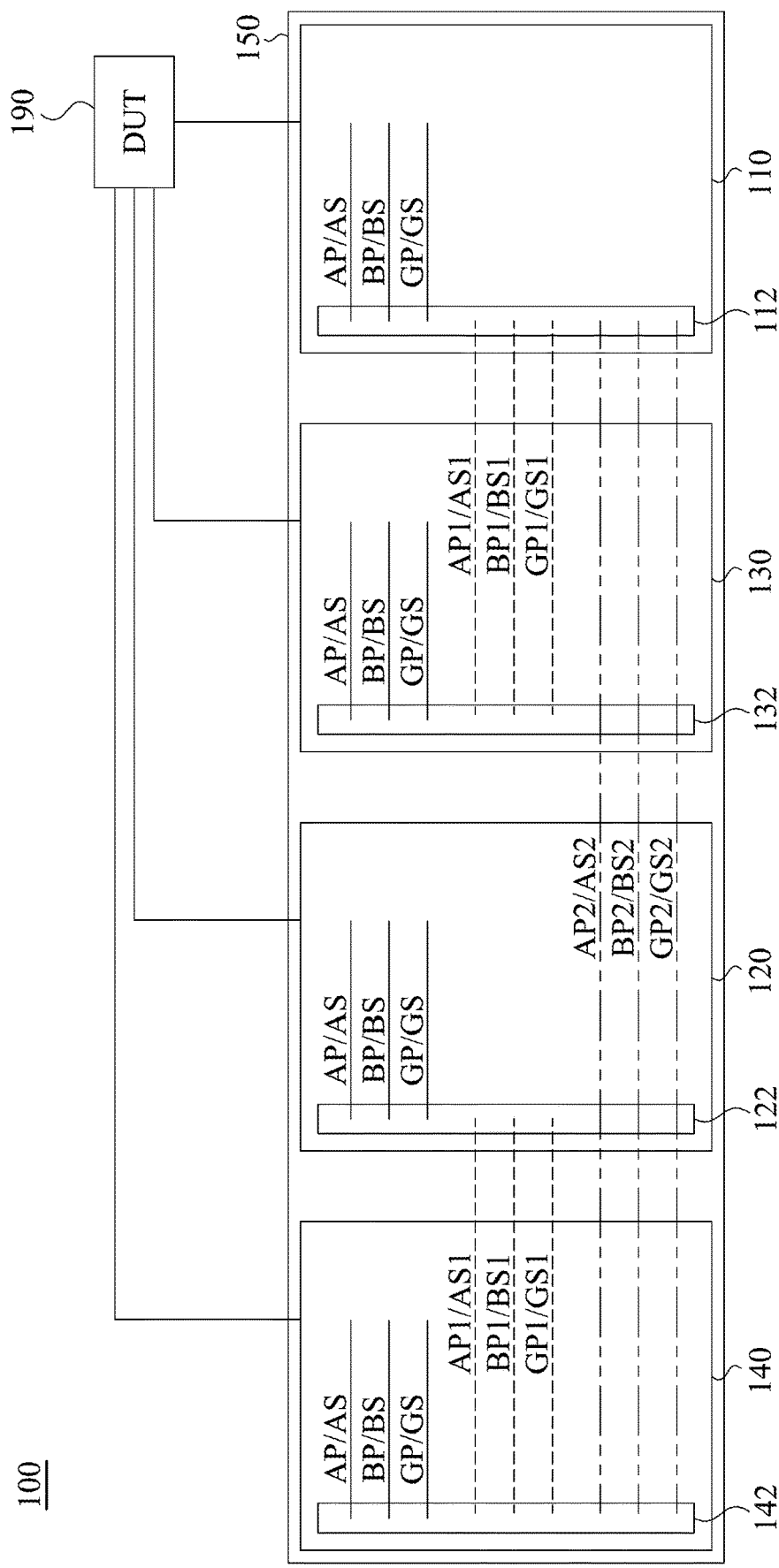
FIG. 1 is a block diagram of a test system according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a test system 100 according to one embodiment of the present disclosure. As shown in FIG. 1, the test system 100 includes a backplane 150, a plurality of test core devices 110, 120, 130 and 140, and a plurality of first buses AP1, AS1, BP1, BS1, GP1, GS1, AP2, AS2, BP2, BS2, GP2 and GS2 (e.g., global buses). It should be noted that the global buses are configured to connect different test core devices. In structure, the plurality of test core devices 110, 120, 130 and 140 are electrically connected to a device under test (DUT) 190. The plurality of first buses AP1, AS1, BP1, BS1, GP1, GS1, AP2, AS2, BP2, BS2, GP2 and GS2 are electrically connected to the test core devices 110, 120, 130 and 140, where at least one set of test core devices selected from the plurality of the test core devices 110, 120, 130 and 140 are merged to be a merged test core device through one or more of the plurality of first buses AP1, AS1, BP1, BS1, GP1, GS1, AP2, AS2, BP2, BS2, GP2 and GS2.

As to aforesaid at least one set of test core devices, for an example, a set of the test core devices 120 and 140 can be merged to be a merged test core device through the first buses AP1, AS1, BP1, BS1, GP1 and GS1, and this merged test core device and the other test core devices 130 and 110 test the DUT in parallel.

As to aforesaid at least one set of test core devices, for another example, a set of the test core devices 130 and 110 can be merged to be a merged test core device through the first buses AP1, AS1, BP1, BS1, GP1 and GS1, and this merged test core device and the other test core devices 120 and 140 test the DUT in parallel.

As to aforesaid at least one set of test core devices, for yet another example, a set of the test core devices 110, 120, 130 and 140 can be merged to be a merged test core device through the first buses AP2, AS2, BP2, BS2, GP2 and GS2.

Figure 2:
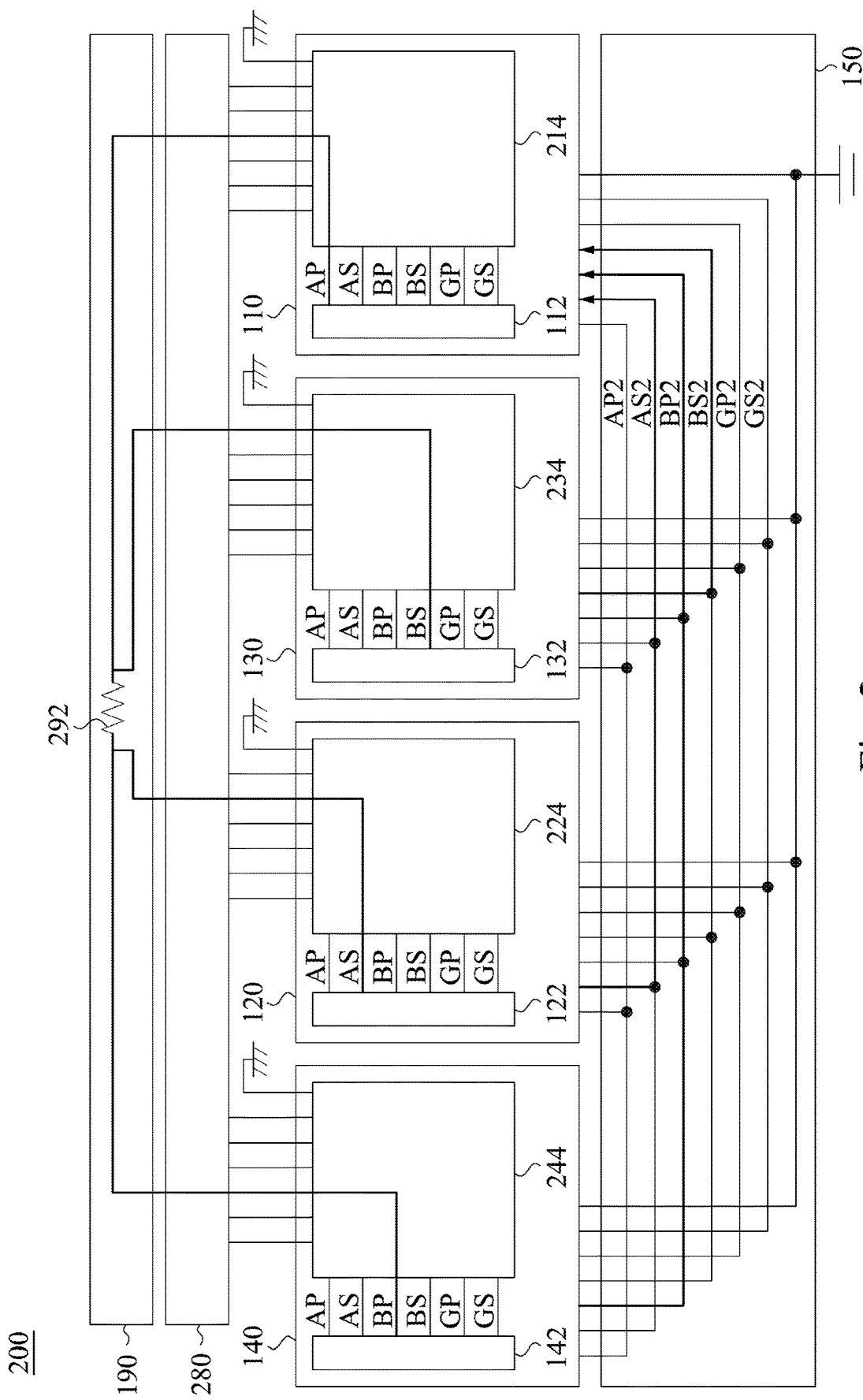
FIG. 2 is a block diagram of a test system according to another embodiment of the present disclosure.

FIG. 2 is a block diagram of a test system 200 according to another embodiment of the present disclosure. As shown in FIG. 2, the plurality of test core devices 110, 120, 130 and 140 are electrically connected to the DUT 190 through a fixture 280, such as a testing fixture or a testing apparatus.

The test core device 110 includes at least one switching device 214 (e.g., a switching circuit board), a controller 112 (e.g., an analog test controller, a digital test controller, or the like) and a plurality of second buses AP, AS, BP, BS, GP and GS (e.g., local buses). It should be noted that each test core device can have its own local buses for interconnection. For example, the test core device 110 has its own second buses AP, AS, BP, BS, GP and GS as local buses for interconnecting the controller 112 and the switching device 214. In structure, the at least one switching device 214 is electrically connected to the one or more of the plurality of first buses AP2, AS2, BP2, BS2, GP2 and GS2. The controller 112 is electrically connected to the at least one switching device 214. The plurality of second buses AP, AS, BP, BS, GP and GS are electrically connected to the controller and at least one switching device 214.

The test core device 120 includes at least one switching device 224 (e.g., a switching circuit board), a controller 122 (e.g., an analog test controller, a digital test controller, or the like) and a plurality of second buses AP, AS, BP, BS, GP and GS (e.g., local buses). It should be noted that each test core device can have its own local buses for interconnection. For example, the test core device 120 has its own second buses AP, AS, BP, BS, GP and GS as local buses for interconnecting the controller 122 and the switching device 224. In structure, the at least one switching device 224 is electrically connected to the one or more of the plurality of first buses AP2, AS2, BP2, BS2, GP2 and GS2. The controller 122 is electrically connected to the at least one switching device 224. The plurality of second buses AP, AS, BP, BS, GP and GS are electrically connected to the controller and at least one switching device 224.

The test core device 130 includes at least one switching device 234 (e.g., a switching circuit board), a controller 132 (e.g., an analog test controller, a digital test controller, or the like) and a plurality of second buses AP, AS, BP, BS, GP and GS (e.g., local buses). It should be noted that each test core device can have its own local buses for interconnection. For example, the test core device 130 has its own second buses AP, AS, BP, BS, GP and GS as local buses for interconnecting the controller 132 and the switching device 234. In structure, the at least one switching device 234 is electrically connected to the one or more of the plurality of first buses AP2, AS2, BP2, BS2, GP2 and GS2. The controller 132 is electrically connected to the at least one switching device 234. The plurality of second buses AP, AS, BP, BS, GP and GS are electrically connected to the controller and at least one switching device 234.

The test core device 140 includes at least one switching device 244 (e.g., a switching circuit board), a controller 142 (e.g., an analog test controller, a digital test controller, or the like) and a plurality of second buses AP, AS, BP, BS, GP and GS (e.g., local buses). It should be noted that each test core device can have its own local buses for interconnection. For example, the test core device 140 has its own second buses AP, AS, BP, BS, GP and GS as local buses for interconnecting the controller 142 and the switching device 244. In structure, the at least one switching device 244 is electrically connected to the one or more of the plurality of first buses AP2, AS2, BP2, BS2, GP2 and GS2. The controller 142 is electrically connected to the at least one switching device 244. The plurality of second buses AP, AS, BP, BS, GP and GS are electrically connected to the controller and at least one switching device 244.

In use, the test core devices 110, 120, 130 and 140 can be merged to be the merged test core device for testing the DUT 190. The test core device 110 sends a electrical signal (e.g., voltage) to the DUT 190, the test core device 140 receives the electrical signal through the DUT 190, and an output of the test core device 140 is switched to be electrically connected to the test core device 110 through the first bus BP2, so that the test core device 110 measures a test signal through the DUT 190. For example, the test core device 110 measures the test signal (e.g., test current) through a resistor 292 of the DUT 190.

Figure 3:
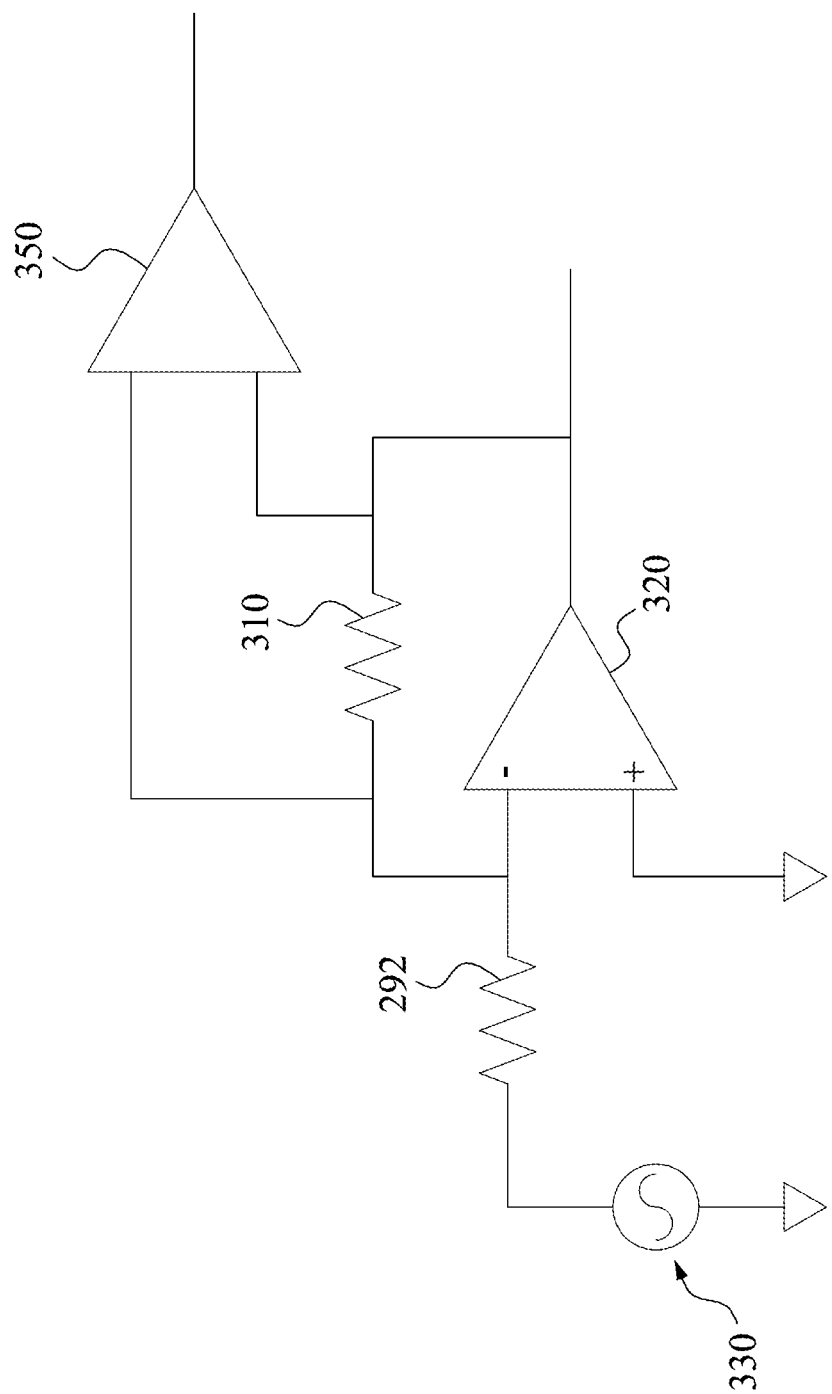
FIG. 3 is a circuit diagram of an amplifier according to one embodiment of the present disclosure.

For a more complete understanding of measuring the test signal, referring FIG. 3, FIG. 3 is a circuit diagram of an amplifier 320 according to one embodiment of the present disclosure. In use, a electrical signal source 330 sends the electrical signal to the resistor 292, and a voltmeter 350 can measure a electrical signal across the resistor 310. Since the resistance value of the resistor 310 is recorded in the test core device 110, the electrical signal across the resistor 310 divided by the resistance value of the resistor 310 equals the test signal through the resistor 292 and the resistor 310. Furthermore, the electrical signal across the resistor 292 divided by the test signal equals a resistance value of the resistor 292.

In FIG. 2, the test core device 120 and the test core device 130 electrically connects two terminals of the DUT 190 respectively, and outputs of the test core devices 120 and 130 are switched to be electrically connected to the test core device 110 through the first buses AS2 and BS2, so that the test core device 110 can measure a test electrical signal through the DUT 190. For example, the test core device 110 includes a voltmeter to measure the test electrical signal through the resistor 292 of the DUT 190.

In one embodiment, the amount of the at least one set of test core devices to be merged is related to the amount of test points of the DUT 190. For example, when the amount of test points of the DUT 190 is greater than a first value (e.g., 2048), the test core devices 110, 120, 130 and 140 can be merged to be the merged test core device for testing the DUT 190. When the amount of test points of the DUT 190 is less than a second value (e.g., 1024), the test core devices 110, 120, 130 and 140 can individually test the DUT 190 in parallel. When the amount of test points of the DUT 190 is ranged between the second value and the first value, the test core devices 140 and 120 can be merged to be a first merged test core device, and the test core devices 130 and 110 can be merged to be a second merged test core device, so that the first merged test core device and the second merged test core device can individually test the DUT 190 in parallel.

Figure 4:
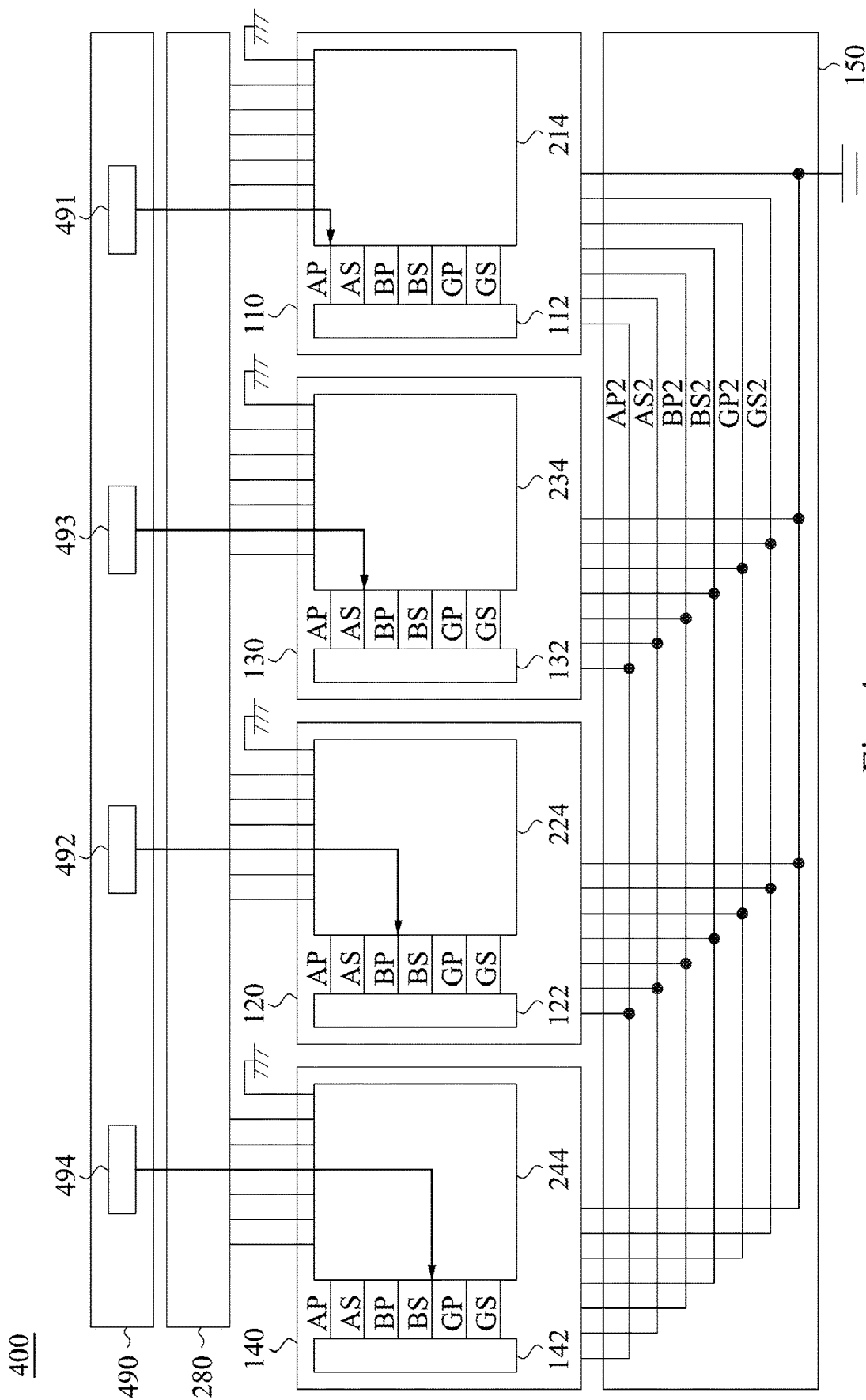
FIG. 4 is block diagram of a test system according to yet another of the present disclosure.
Figure 5:
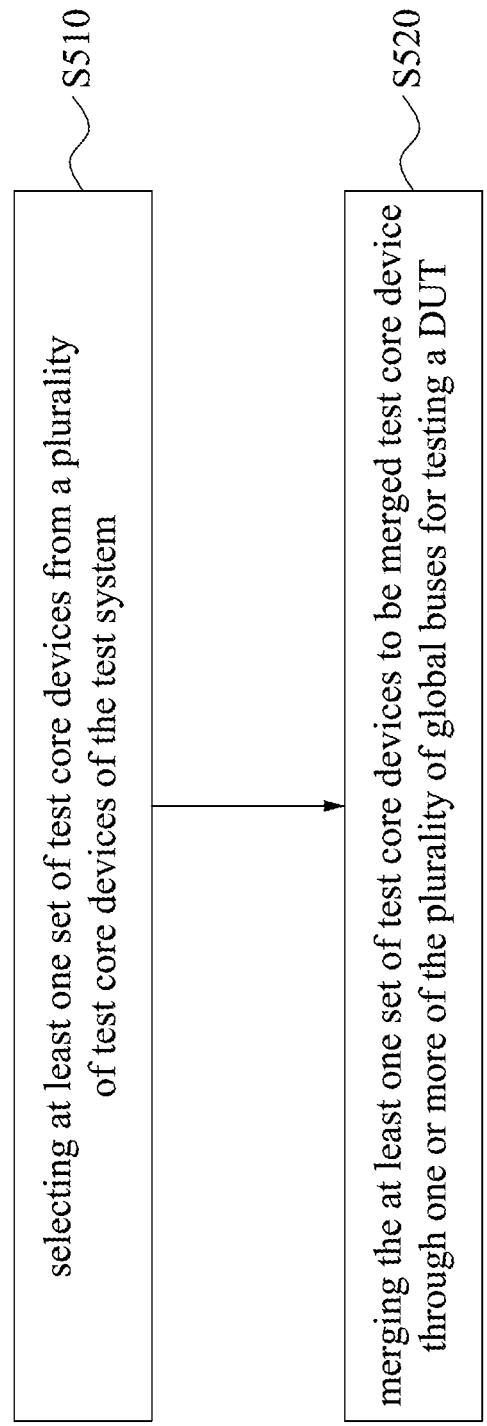
FIG. 5 is a flow chart of a method according to one embodiment of the present disclosure.

FIG. 4 is block diagram of a test system 400 according to yet another of the present disclosure. The test system 400 is structurally the same as the test system 200, except that a DUT 490 includes sub-devices 491, 492, 493 and 494, such as low-dropout regulators (LDOs) or other circuits.

In FIG. 4, For example, when the amount of test points of the DUT 490 is greater than the first value (e.g., 2048), test core devices 110, 120, 130 and 140 are merged to be the merged test core device for testing the DUT 490. However, the test core devices 110, 120, 130 and 140 can still respectively test the sub-devices 491, 492, 493 and 494 in parallel.

In structure, the switching device 214 is electrically connected to the sub-device 491, the switching device 224 is electrically connected to the sub-device 492, the switching device 234 is electrically connected to the sub-device 493, and the switching device 244 is electrically connected to the sub-device 494.

In use, the controller 112 measures an electrical characteristic (e.g., voltage) from the sub-device 491 through the switching device 214 and the second bus AP, the controller 122 measures an electrical characteristic (e.g., voltage) from the sub-device 492 through the switching device 224 and the second bus BP, the controller 132 measures an electrical characteristic (e.g., voltage) from the sub-device 493 through the switching device 234 and the second bus AS, and the controller 142 measures an electrical characteristic (e.g., voltage) from the sub-device 494 through the switching device 244 and the second bus BS.

For a more complete understanding of a method of operating the test system 100, 200 and/or 400, referring FIGS. 1-5, FIG. 5 is a flow chart of the method 400 according to an embodiment of the present disclosure. As shown in FIG. 4, the method 400 includes operations S510 and S520. However, as could be appreciated by persons having ordinary skill in the art, for the steps described in the present embodiment, the sequence in which these steps is performed, unless explicitly stated otherwise, can be altered depending on actual needs; in certain cases, all or some of these steps can be performed concurrently.

The method 400 may take the form of a computer program product on a computer-readable storage medium having computer-readable instructions embodied in the medium. Any suitable storage medium may be used including non-volatile memory such as read only memory (ROM), programmable read only memory (PROM), erasable programmable read only memory (EPROM), and electrically erasable programmable read only memory (EEPROM) devices; volatile memory such as SRAM, DRAM, and DDR-RAM; optical storage devices such as CD-ROMs and DVD-ROMs; and magnetic storage devices such as hard disk drives and floppy disk drives.

In operation S510, at least one set of test core devices are selected from a plurality of test core devices 110, 120, 130 and 140 of the test system 100, 200 and/or 400. In operation S520, the at least one set of test core devices are merged to be a merged test core device through one or more of the plurality of first buses AP1, AS1, BP1, BS1, GP1, GS1, AP2, AS2, BP2, BS2, GP2 and GS2 for testing the DUT 190.

In one embodiment, the operation S510 includes steps of: receiving a merging signal; selecting the at least one set of test core devices according to the merging signal. For example, the merging signal can be send from a computer electrically connected to the test system 100, and the merging signal designates the at least one set of test core devices as the merged test core device.

In another embodiment, the operation S510 includes steps of: acquiring the amount of test points of the DUT 190; determining a merged amount based on the amount of test points of the DUT 190; selecting the at least one set of test core devices according to the merged amount. For example, the test system 100 can acquire the amount of test points of the DUT 190 through the fixture 280.

In view of the above, the test system 100, 200 and/or 400 and the method 400 can automatically and flexibly test the DUT 190, without any additional wire.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A test system, comprising:
a plurality of test core devices electrically connected to a device under test (DUT); and
a plurality of first buses electrically connected to the test core devices, wherein at least one set of test core devices selected from the plurality of test core devices are merged to be a merged test core device through one or more of the plurality of first buses,
wherein a respective one of the plurality of test core devices comprises: at least one switching device electrically connected to the one or more of the plurality of first buses; and a controller electrically connected to the at least one switching device, wherein both of the at least one switching device and the controller are disposed within the respective one of the plurality of test core devices.

2. The test system of claim 1, wherein the merged test core device and the other of the plurality of test core devices test the DUT in parallel.

3. The test system of claim 1, wherein the any one of the plurality of test core devices further comprises:
 a plurality of second buses electrically connected to the controller and at least one switching device.

4. The test system of claim 1, wherein the plurality of test core devices comprises a first test core device, a second test core device, a third test core device and a forth test core device, the first test core device, the second test core device, the third test core device and the forth test core device are merged to be the merged test core device for testing the DUT, the first test core device sends a electrical signal to the DUT, the forth test core device receives the electrical signal through the DUT, and an output of the forth test core device is switched to be electrically connected to the first test core device through the one or more of the plurality of first buses, so that the first test core device measures a test signal through the DUT.

5. The test system of claim 4, wherein the second test core device and the third test core device electrically connects two terminals of the DUT respectively, and outputs of the second test core device and the third test core device are switched to be electrically connected to the first test core device through the one or more of the plurality of first buses, so that the first test core device measures a test electrical signal through the DUT.

6. The test system of claim 1, wherein the amount of the at least one set of test core devices to be merged is related to the amount of test points of the DUT.

7. The test system of claim 1, wherein the DUT comprises sub-devices, and the test core devices respectively test the sub-devices in parallel.

8. A method of operating a test system, comprising steps of:
 selecting at least one set of test core devices from a plurality of test core devices of the test system; and
 merging the at least one set of test core devices to be a merged test core device through one or more of the plurality of first buses for testing a DUT,
 wherein a respective one of the plurality of test core devices comprises: at least one switching device electrically connected to the one or more of the plurality of first buses; and a controller electrically connected to the at least one switching device, wherein both of the at least one switching device and the controller are disposed within the respective one of the plurality of test core devices.

9. The method of claim 8, wherein the step of selecting the at least one set of test core devices comprises:
 receiving a merging signal; and
 selecting the at least one set of test core devices according to the merging signal.

10. The method of claim 8, wherein the step of selecting the at least one set of test core devices comprises:
 acquiring the amount of test points of the DUT;
 determining a merged amount based on the amount of test points of the DUT; and
 selecting the at least one set of test core devices according to the merged amount.

* * * * *